US006887791B2

(12) United States Patent
Jung

(10) Patent No.: US 6,887,791 B2
(45) Date of Patent: May 3, 2005

(54) OPTIMIZATION METHODS FOR ON-CHIP INTERCONNECT GEOMETRIES SUITABLE FOR ULTRA DEEP SUB-MICRON PROCESSES

(75) Inventor: Won-Young Jung, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/327,308

(22) Filed: Dec. 19, 2002

(65) Prior Publication Data

US 2003/0228757 A1 Dec. 11, 2003

Related U.S. Application Data

(60) Provisional application No. 60/387,027, filed on Jun. 6, 2002.

(51) Int. Cl.[7] .................... H01L 21/302; H01L 21/461
(52) U.S. Cl. .................. 438/689; 438/737; 438/761
(58) Field of Search ................. 438/689, 714, 438/717, 737, 738, 761

(56) References Cited

U.S. PATENT DOCUMENTS

| | | | |
|---|---|---|---|
| 5,663,797 | A | 9/1997 | Sandhu |
| 5,878,053 | A | 3/1999 | Koh et al. |
| 5,896,300 | A | 4/1999 | Raghavan et al. |
| 5,903,886 | A | 5/1999 | Heimlich et al. |
| 6,018,623 | A | 1/2000 | Chang et al. |
| 6,124,143 | A | 9/2000 | Sugasawara |
| 6,185,706 | B1 | 2/2001 | Sugasawara |
| 6,189,131 | B1 | 2/2001 | Graef et al. |
| 6,219,631 | B1 | 4/2001 | Oh et al. |
| 6,280,290 | B1 | 8/2001 | Birang et al. |
| 6,286,126 | B1 | 9/2001 | Raghavan et al. |
| 6,488,568 | B1 | 12/2002 | Treur et al. |
| 6,603,323 | B1 * | 8/2003 | Miller et al. ........... 324/754 |

OTHER PUBLICATIONS

Chen et al, "A Novel Multi-Level Interconnect Scheme with Air as Low K Inter-Metal Dielectric for Ultradeep Submicron Application," *Solid-State Electronics* 45 (2001) 199–203.
Rochel et al., "Full-Chip Signal Interconnect Analysis for Electromigration Reliability," *IEEE USQED 2000*, pp. 337–340.
Yuan et al., "A Parallel Implementation of a Fast Multipole Based 3–D Capacitance Extraction Program on Distributed Memory Multicomputers," *14th International Parallel and Distributed Processing Symposium IPDPS 2000*, pp. 323–330.
Salch et al., Full-Chip Verification of UDSM Designs, *1998 IEEE-ACM International Conference on Computer-Aided Design*, 1998 pp. 453–460.
International Search Report for International Appl. No. PCT/US03/16164 for Cadence Design System, Inc., mailed Apr. 2, 2004.

* cited by examiner

*Primary Examiner*—Phuc T. Dang
(74) *Attorney, Agent, or Firm*—Parsons Hsue & De Runtz LLP

(57) ABSTRACT

The present invention presents optimization methods for interconnect geometries that readily extend to the UDSM region for determining on-chip interconnect process parameters more realistically and accurately than in the prior art. A method for reconstruction flow that re-assembles each of a number of optimized structures into one optimized interconnect process file, such as a process technology file for extractors. This optimized process technology file can use not only extracted interconnect process parameters but also the input of LPE (Layout Parasitic Extraction) tools in physical verification stage.

28 Claims, 4 Drawing Sheets

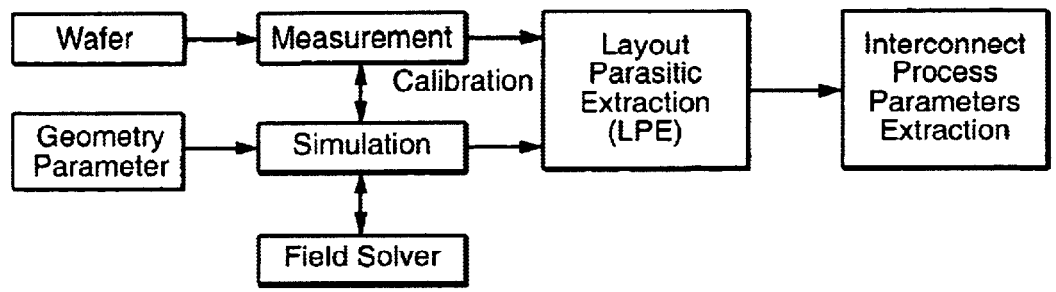
FIG._1
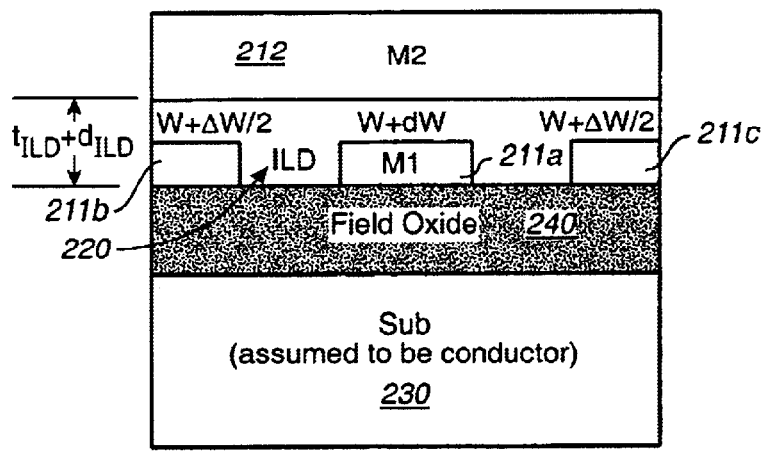
FIG._2a
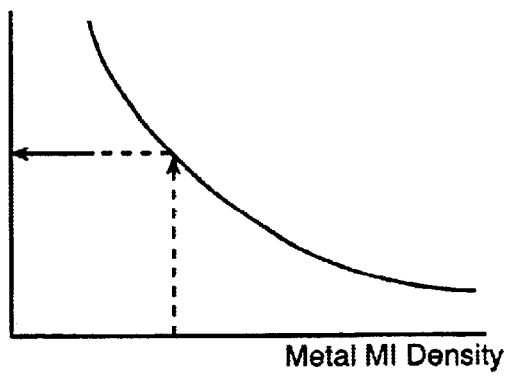
FIG._2b

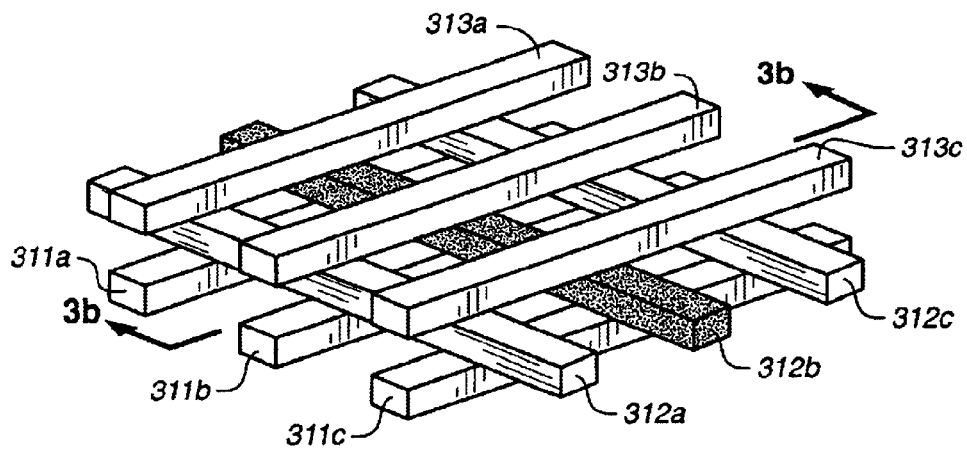
FIG._3a
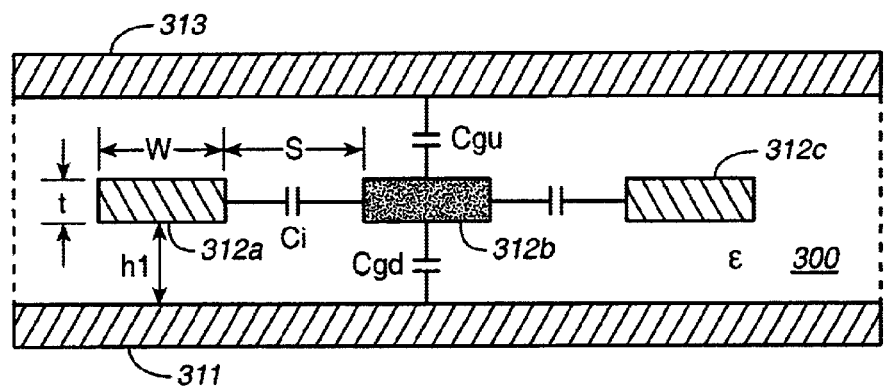
FIG._3b
Interconnect Cross Section for Simulation Without Top Plate
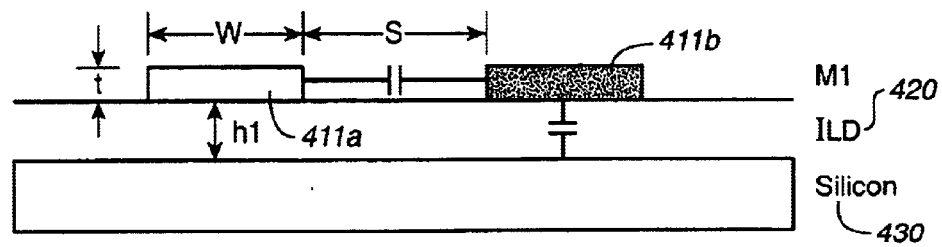
FIG._4

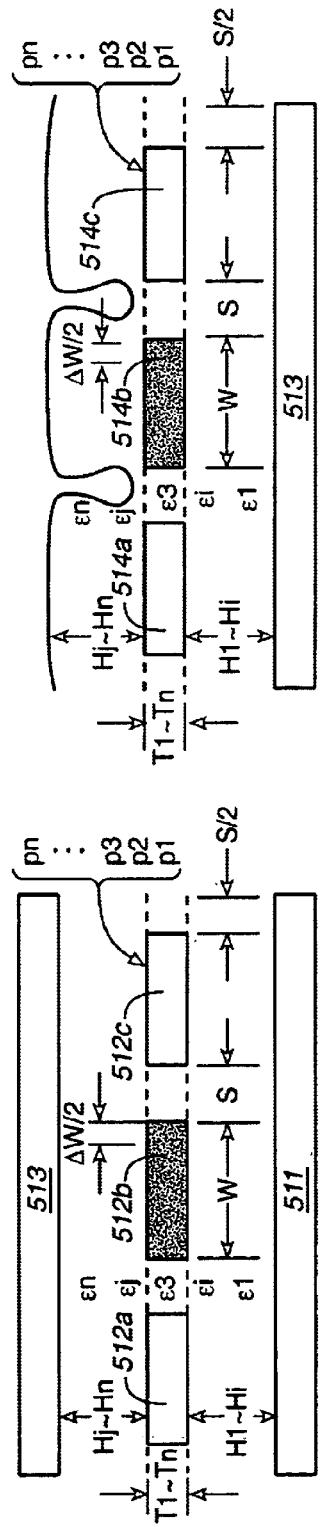
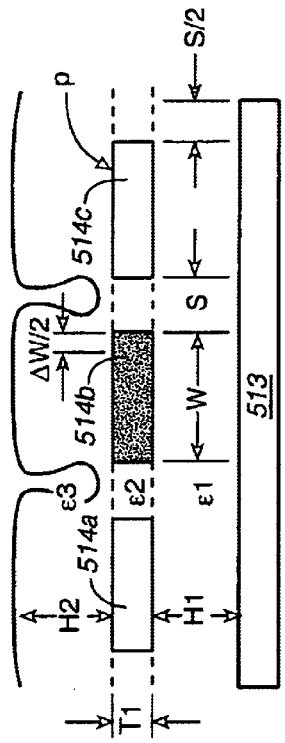
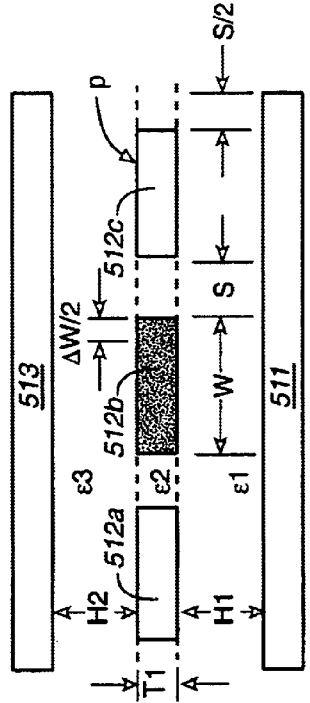
FIG. 5a — With Top Plate
FIG. 5b — Without Top Plate
FIG. 6a — With Top Plate
FIG. 6b — Without Top Plate

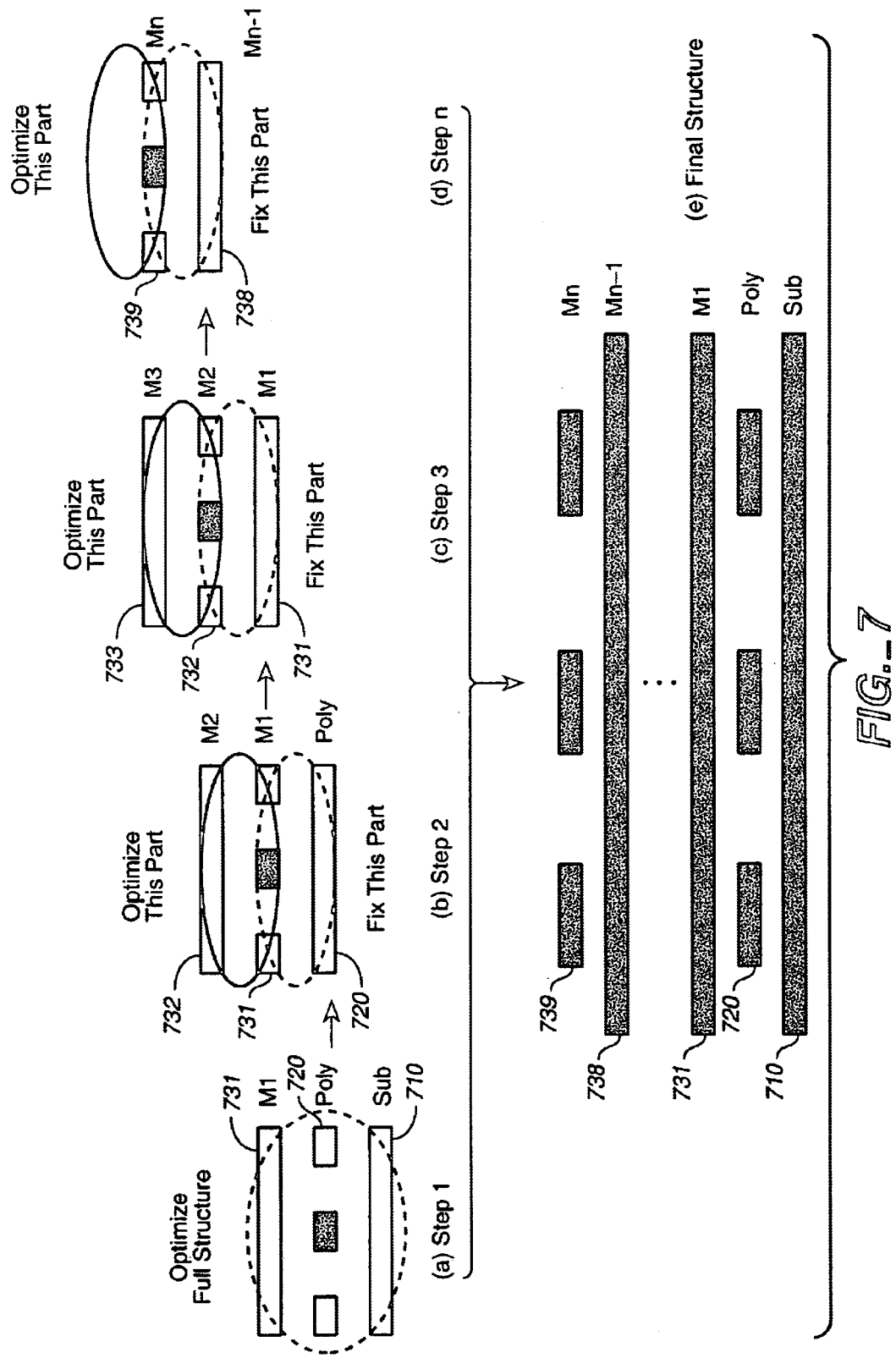
FIG._7

US 6,887,791 B2

OPTIMIZATION METHODS FOR ON-CHIP INTERCONNECT GEOMETRIES SUITABLE FOR ULTRA DEEP SUB-MICRON PROCESSES

The present application claims priority from provisional U.S. patent application Ser. No. 60/387,027, filed Jun. 6, 2002.

BACKGROUND OF THE INVENTION

This invention pertains to the field of simulating the operation of integrated circuits, and has application to the interconnects of deep sub-micron devices.

In the modeling and simulation of integrated circuits, all of the various parts need to be considered. Some of these circuit elements can be neglected in some circumstances, but begin to introduce non-negligible effects in other circumstances. Similarly, models and techniques that are effective in one regime begin to become unreliable when pushed into other regimes. In particular, one set of integrated circuit elements is the on-chip interconnect elements. Although there are a number of prior art optimization methods, the accuracy of these methods has become increasingly inaccurate as technology has extended into Ultra-Deep Sub-Micron (UDSM) processing.

In deep sub-micron semiconductor process technologies, interconnect delays can easily dominate gate propagation delays as major contributors to the total delay through signal paths of an integrated circuit device. Accordingly, it is important that interconnect delays be thoroughly and accurately accounted for in computer simulations of integrated circuits designs. Otherwise, unexpected timing problems in the resulting silicon may require time consuming and costly redesigns with little or no guidance on how to correct the problems. Various aspects of ultra-deep submicron technology are presented in "Full Chip Verification of UDSM Designs", R. Saleh et al., Proceedings of 1998 IEEE/ACM International Conference on Computer Aided Design, pp. 453–460, which is hereby incorporated by reference.

In addition to delay, crosstalk is an issue in the design of interconnect structures for circuitry. As circuitry is increasingly miniaturized, neighboring interconnects are brought into closer proximity. As a result, undesired signal coupling among interconnects is increased.

A highly specialized field, commonly referred to as "electronic design automation" (EDA), has evolved to handle the demanding and complicated task of designing semiconductor chips. In EDA, computers are extensively used to automate the design processes. Computers are ideally suited to performing tasks associated with the design process because computers can be programmed to reduce or decompose large complicated circuits into a multiple of much simpler functions. Thereupon, the computers can be programmed to iteratively solve these much simpler functions. Largely, the design process has become such that integrated circuit (IC) chips cannot be designed without the help of computer-aided design (CAD) systems.

Generally, interconnect characterization consists of T/P (Test Pattern) draw, wafer fabrication, measurement, and extraction and optimization with simulation. FIG. 1 is a schematic diagram of a conventional interconnect characterization flow. Starting from a wafer having a copy of the circuit to be simulated, a set of measurements is made. With a set of input parameters, a simulation can be ran using the field solver and then compared with the measurements from the wafer to calibrate the simulation. From the simulation and measurement results, a layout parasitic extraction (LPE) is then performed, followed by the extraction of the interconnect process parameters. Aspects of parasitic extraction are described further in U.S. patent application Ser. No. 09/969,186, filed Sep. 27, 2001, which is hereby incorporated by reference.

Some features of the extraction/optimization of interconnect process parameters are shown with respect to FIG. 2. FIG. 2a shows a portion of a structure having a series of metal interconnects from metal layer M1, 211a, 211b, 211c, running into the page below a metal layer M2 running along the page. The layer M1 is separated from the substrate 230 (assumed to be a conductor) by the field oxide 240, and from the M2 layer by inter-layer dielectric ILD 220, which is also between the different lines, 211a–c, of M1. Each metal line of M1 is taken to have a width W with a process variation of $\Delta W$. As shown FIG. 2b, the process of determining existing inter-layer dielectric ILD 220 thickness consists of capacitance simulations, electrical measurements and mathematical interpolations. For example, the density of metal layer M1 is extracted from the layout, and the capacitance or ILD thickness is then determined using mathematical interpolation. More details of this approach can be found in "A Statistical Metrology Framework for Characterizing ILD Thickness Variation in CMP Process", Eric Choong-Yin Chang, Ph.D. Thesis, MIT, February 1996, which is hereby incorporated by reference.

Other prior art work, described in "3-sigma Worst-Case Calculation of Delay and Crosswalk for Critical Net", N. Chang, 1998 ACM/IEEE International workshop on Timing Issues in the Specification and Synthesis of Digital Systems and in U.S. Pat. No. 6,018,623, both of which are hereby incorporated by reference, suggests generating randomized but correlated R and C values using the Monte-Carlo simulation instead of measurement. To determine the interconnect parameters, a typical interconnect simulation structure requires information on interlayer dielectrics, metal thickness, width and spacing, and dielectric thickness, as shown for three metallization layers in FIGS. 3a and 3b. FIG. 3a is a perspective view of a three layer interconnect with the dielectrics not shown. The interconnect model includes a metal array of three interconnects 312a–c above an orthogonal array of interconnects 311a–c and below an orthogonal array of interconnects 313a–c. FIG. 3b is a side sectional view of the interconnect structure of FIG. 3a, taken along lines 3b—3b.

The idealized structure of FIG. 3b contains a metal array in a metal layer, such as 312a–c, on top of an orthogonal array 311 and below another orthogonal metal array 313, with the area in between these filled with inter-layer dielectric. Lines 312a and 312c are taken at ground and 312b is taken to be at a higher voltage. By convention, metal array 311 is referred to as metal 1 or M1, metal array 312a–c is referred to as metal 2 or M2, and metal array 313 is referred to as metal 3 or M3, although, strictly speaking, these layers may not be metal but another conductive layer. Individual runs of metal connecting coupled gates are referred to as interconnects. The metal layers are separated and supported by interlayer dielectric material 300 having a dielectric constant $\epsilon$. Other material and geometry values include the coupling capacitance per unit length, Ci, between adjacent interconnects of the metal array 312; capacitance per unit length, Cgu, between interacting portions of the metal array 312 and the orthogonal array 313 above; and capacitance per unit length, Cgd, between the metal array 312 and the orthogonal array 311. Still other material and geometry values include the height h1 between the interlayer dielectric material 300 between the metal array 312 and the orthogonal bottom metal array 311 below it, and the height h2 of the interlayer dielectric 300 between the metal array 312 and the orthogonal top metal array 313 above it. Other material and geometry values for M2 include its thickness t, its width W, its spacing S between adjacent cords 312a and 312b, its resistivity ρ, and resistance per unit length R as determined from t, W, and ρ. Although not shown, corresponding material and geometry values may be defined for other metallization layers.

When using a EDA tools to simulate the operation of the circuit, an interconnect model file (IMF) is generated. For example, an IMF may include an R, C nominal table and an R, C sensitivity table for each type of interconnect arrangement in an integrated circuit design. The R, C nominal table provides nominal resistance and capacitance parameters for specified range widths and spacings, and the R, C sensitivity table provides sensitivity data for R, C parameters with respect to changes in material and geometry values. Data for the IMF is generated from data provided in an interconnect technology file (ITF) based on these various parameters. More details are described in U.S. Pat. No. 6,219,631, which is hereby incorporated by reference, and other aspects related interconnects are given in U.S. Pat. No. 6,189,131, which is also hereby incorporated by reference Another variation, as described in "Circuit Sensitivity to Interconnect Variation," by Zhihao Lin, IEEE Transactions on Semiconductor Manufacturing, Vol. 11, No. 4, November 1998, also hereby incorporated by reference, which does not use the top plate (M3 in FIG. 3). This variation is shown in FIG. 3b, which is labeled similarly to FIG. 3a. In this case, the layer M1 is take as the metal layer 411 that is placed above the silicon layer 430, from which it is separated by the interlayer dielectric (ILD) 420.

As feature sizes decrease, these prior art methods become increasingly inaccurate and improvements are needed.

SUMMARY OF THE INVENTION

The present invention presents optimization methods for interconnect geometries that readily extend to the UDSM region for determining on-chip interconnect process parameters more realistically and accurately than in the prior art. A method for reconstruction flow that re-assembles each of a number of optimized structures into one optimized interconnect process file like a process technology file for extractors. This optimized process technology file can use not only extract interconnect process parameters but also the input of LPE (Layout Parasitic Extraction) tools in physical verification stage.

In a principle aspect of the present invention, the interconnect structure is broken down vertically into substructures. A first substructure is optimized to establish some of the interconnect parameter values. A second substructure that overlaps with the first is then optimized, but with the previously established parameter values held fixed. For example, a portion of the structure consisting of the substrate, a poly layer, and the first interconnect layer is optimized to obtain a set of parameter values. Subsequently, the poly layer, the first interconnect layer, and a second interconnect layer are optimized, but keeping the parameter values from the substrate/poly/first interconnect substructure fixed. This process continues until the top layer is reached. Alternately, a top down approach can be used. If further refinement is needed, the structure as a whole can be re-optimized at the end.

In a further aspect of the present invention, the present invention allows for the incorporation of multi-layer dielectrics between layers (ILDs) and different intra-layer dielectrics, allowing for dielectric anisotropy to be incorporated. Multi-layer conductors for the interconnects are also incorporated. The dielectric characterization allows for conformal as well as planar structures.

Additional aspects, features and advantages of the present invention are included in the following description of exemplary embodiments, which description should be read in conjunction with the accompanying drawings.

BRIEF DESCRIPTION OF THE DRAWINGS

FIG. 1 is a schematic diagram of a conventional interconnect characterization flow.

FIGS. 2a and 2b illustrate an example of interconnect parameter extraction from prior art, with a fingered simulation structure in FIG. 2a and the inter-layer dielectric thickness extraction in FIG. 2b.

FIG. 3a is a perspective view of a three layer interconnect with the dielectrics not shown.

FIG. 3b is a side sectional view of the interconnect structure of FIG. 3a, taken along lines 3b—3b.

FIG. 4 is an interconnect cross section for simulation without top plate.

FIGS. 5a and 5b show a first embodiment for multi-dielectric/conductor simulation.

FIGS. 6a and 6b show a second embodiment for multi-dielectric/conductor simulation.

FIG. 7 illustrates the steps of a reconstruction technology file.

DESCRIPTION OF EXEMPLARY EMBODIMENTS OF THE INVENTION

The prior art has a number of problems that lead to inaccuracies in the ultra-deep sub-micron (UDSM) region. The first of these is that the resistance and capacitance may be strongly correlated. Previous work just considers capacitance, whereas R and C are often strongly correlated in the real situations as they share common width W and length L values for the interconnect layers. When interconnect feature size is large, capacitance is dominant, but as feature size becomes smaller and smaller, the resistive part of the impedance increase and can become dominant in UDSM processes.

Another weakness in the prior art is that its optimized interconnect structure is incomplete. It is common in UDSM devices to use multi-dielectric and multi-conductor processes, which are not accounted for in current interconnect structures, or templates. Although in some cases these may be treated by effective values, the problem is then how to assign the effective dielectric thickness, dielectric constant, conductor thickness, resistivity of conductor, and so on. Further, a number of current processes have introduced low K dielectric constant structures that result in an anisotropic interconnect structure, where, for example, in FIG. 3b the dielectric value contributing to the capacitance Cgu will differ from the dielectric value contributing to the capacitance Ci. Moreover current interconnect structures are too simple and suitable for certain operating ranges. All of these factors can affect accuracy or produce wrong values.

The interconnect structure found in the prior is also too simple for designer simulation of critical path or current equivalent interconnect. The prior art methods can not cover conformal structures. The state-of-art processes for low K process structures are often conformal, not only the top layer but also for intermediate layers. Aspects of low K dielectrics and Cu-damascene processing is described, for example, in "A novel multi-level interconnect scheme with air as a low K inter-metal dielectric for ultradeep submicron application", C. Chen et al. in Solid-State Electronics, vol. 45, no. 1, pp. 199–203 (2001), which is hereby incorporated by reference.

The current optimization methods use each generic interconnect structure for certain combinations that are inconsistent. For example, consider the case where an M1 layer runs upon a conductive polysilicon layer and under the M2 layer, with the M2 layer in turn running under an M3 layer, similar to the structures shown in FIGS. 2–4. In the prior, the M1 and M2 layers are optimized separately, even though they are correlated through M2 and the dielectric between M1 and M2. This can result in different, inconsistent values for, say, the parameter h1, with one value (say h1) coming from optimizing the M1 layer and a second value (say h1') from optimizing the M2 layer. Thus, the interconnect optimization is not a one to one mapping as it can produce differing values h1 and h1'. The prior art is dependent upon such generic structures as would lead to this sort of inconstancies.

These inconsistencies make it difficult to use optimized interconnect process parameters for interfacing with a Layout Parasitic Extraction (LPE) or EDA tools. Circuit simulators need the interconnect parasitic values, but if a user wants to interface to an LPE tool, the user has to provide interconnect parameters as a process technology file. Due to having several values for the same parameter, the LPE tool's result will have errors generated by process variations. Using the previous example, the value of h1 will differ from one file to another and, when these differing values are entered, the resulting inconsistencies will result in errors.

Various aspects of the present invention improve over the prior art by, among other features, addressing the problems described above. Features of the present invention include the use of a generic interconnect structure, a technique allowing the extraction of dielectric constants suitable for conformal multi-dielectric layers, methods to reconstruct the process technology file for the full interconnect structure. This effective geometry concept is useful for multi-conductor and multi-dielectric structures.

FIGS. 5a and 5b show two different types of interconnect structures to be used in optimization according to a first embodiment of the present invention. FIG. 5a shows a structure with a "top plate" layer 513 that can be used in intermediate structure optimization, for example for an intermediate metal layer such as M2 with lines 512a–c above layer 511 and below the top plate (for this particular optimization) layer 513. FIG. 5b lacks a top plate layer and can be used, for example, on the optimization of top metal layer that is cover only by a passivation layer. The first embodiment of the present invention uses for optimization/ analysis in UDSM processes where the designer would like a fuller description of the interconnect parameters.

As shown in FIG. 5a, a pair of layers 511 and 513, for example M1 and M3, run along the page, with an intermediate metal layer, M2 in this example, having lines 512a, 512b, and 512c, running into the page. The dielectric between layer 511 and 512a–c can now consist of multiple dielectric layers characterized by $\epsilon_1$-$\epsilon_i$. For example, this inter-metal dielectric layer could be an oxide-nitride-oxide layer or low K dielectric material characterized by dielectric constants $\epsilon_1$–$\epsilon_3$ with thicknesses H1–H3. This total thickness is indicated by H1–Hi in FIG. 5a. Similarly, the dielectric layer between the middle and top metal layers is characterized by dielectric constants $\epsilon_j$-$\epsilon_n$ and thickness Hj-Hn. The intra-layer dielectric between the lines of the intermediate interconnect lines 512 is indicated by $\epsilon_i+1$, although this may also be a multiple dielectric layer. As noted in the figures, in the case of m multiple dielectric layers for the intra-layer dielectric, $\epsilon_i+1$ would be replaced by a series values (taking i=2 to simplify the notation) $\epsilon_3 \rightarrow (\epsilon_{3,1}, \ldots, \epsilon_{3,m})$ with a corresponding set of H values (not shown in the figure). The introduction of a different $\epsilon$ value for the lines within a layer (the intra-layer dielectrics), such as between 512a and 512b, than used between the different metal layers, such as between 511 and 512a (the inter-layer dielectrics, ILDs), can be used to include dielectric anisotropy ($\epsilon_{\parallel} \neq \epsilon_{\perp}$) and treat conformal layers in FIGS. 5 and 6.

In another aspect of the present invention, the interconnect lines themselves can be multi-layer. For example, a Cu-damascene process may be used where a line such as 512a is a copper layered inside a barrier metal (Ti or Ta, for example). This is accounted for by the multiple resistivity values, $\rho_1$-$\rho_n$, for layers having thicknesses T1-Tn. The parameters W, S, $\Delta$W are as before. In addition, it should be noted that although the various interconnects are often referred to here as metal for convenience, in general these may be some other conductive material.

FIG. 5b is similar to FIG. 5a, except that it lacks the top plate, such as layer 513 in FIG. 5a. By way of an example, layer 513 in FIG. 5a may be the same as in FIG. 5b, with lines 514a–c being part of an M4 layer. This could be the uppermost interconnect layer and the overlying conformal dielectric layer a passivation layer.

The second embodiment of the present invention uses the arrangement shown in FIGS. 6a and 6b, which are variations of FIGS. 5a and 5b and are similarly labeled. In FIGS. 6a and 6b, only single dielectric layer, characterized by $\epsilon_1$ and H1, is included between layers 511 and 512a–c, and a single layer, characterized by $\epsilon_3$ and H3, is included between layers 512a–c and 513. This model still allows for anisotropy by having an independent dielectric constant $\epsilon_2$ between the lines of the 512 layer. The embodiment of FIGS. 6a and 6b can be used either where the structure is actually simplified in this way relative to FIGS. 5a and 5b or where the user wants to use effective values to represent what are in reality multiple layers. If the user can accurately calculate effective values for dielectric thickness, conductor thickness, dielectric constant, and resistivity of the conductor, the designer can use simplified embodiment of FIGS. 6a and 6b.

An important aspect of the present invention is that the structures of FIGS. 5 and 6 can be varied according to a user's purpose or application. For example, in memory design, time skew is very important and the designer may be concerned with racing problems. If instead it is a microprocessor design case, critical path speed may be the most important quantity. In this case, the designer can, for example, set the simulation edge to metal boundary to be more than eight times dielectric thickness. As assigning the interconnect parameter details is sometimes difficult for the user, the present invention allows for multiple vertical regions, with description and optimization are handled separately.

Another aspect of the present invention allows for the extraction of dielectric constants for conformal multi-dielectric layers using efficient interconnect structures. Using the structures of FIGS. 5 and 6, a designer can extract the missing interconnect parameters or optimize interconnect parameter settings. In addition, the designer can calculate the effective dielectric constant for the conformal multi-dielectric layers using effective structure as shown in FIGS. 6a and 6b. This is an improvement on prior art techniques used for LPE (Layout Parasitic Extraction) tools, as most prior art full-chip extractors cannot readily handle anisotropic and conformal structures or low K dielectric processes.

A further aspect of the present invention is the Re-Construct Process Technology File. During optimization/LPE, the process technology file is broken into several independent, or generic, interconnect structures. As described above, these generic structures can be re-constructed into a single file as a technology file to improve efficiency. This optimization policy or method is described more with respect to FIGS. 7a–e. (FIGS. 7a–e are based on the embodiment of FIGS. 6a and 6b to simplify the discussion, but can also be implemented using the embodiment of FIGS. 5a and 5b, depending on user specifications.)

FIGS. 7a–e show an exemplary embodiment based on an m-polysilicon, n-metal process. For simplicity, the example uses m=1 in order to focus more on the interconnects. More generally, this applies not only to planer structures, but also the conformal case, and also not only to conventional interconnect, but also Cu-Damascene processes.

The exemplary embodiment begins in FIG. 7a by extracting the substrate to poly dielectric thickness using "with top plate" configuration of FIG. 5a or FIG. 6a. The various parameters characterizing the numbered layers and the dielectric layers are suppressed to simplify the discussion both here and in subsequent figures, but these will be as in FIGS. 5 and 6. The structure of FIG. 7a is used for polysilicon lines running over a substrate and under a first metal layer, where the substrate is Sub 710, the polysilicon (or other) layers are collectively Poly 720, and the first interconnect layer is M1 731. This structure, indicated by the broken circle, is optimized first and geometry parameter set is determined for a given generic structure, such as shown in FIG. 5a or 6a. If the designer has parallel plate interconnect structures, the design can use them for this procedure. This process fixes the portion of the total structure related to layers 720 and 731 for the following stages of the process, although, as described below with respect to FIG. 7e, the values established in this first step may be refined by looking at the structure as a whole.

The next stage is shown in FIG. 7b, in a view rotated by 90° relative to FIG. 7a, where the generic Poly layer 720 now runs along the page and M1 731 now runs orthogonal to the page. The dielectric layers are again as in FIG. 5a or 6a. This second step is optimizes the structure of Metal1 (M1 731) running over Poly (720) and under the Metal2 (M2 732) structure. The preceding step has already initially optimized polysilicon thickness and dielectric thickness between polysilicon 720 and metal1 731 and this portion, indicated by the broken oval, is fixed in the current operation. In the current step, Metal1 width, space, delta width, thickness of Metal1, and dielectric thickness between Metal1 and Metal2, indicated by the solid oval, are optimized.

The process continues in the same fashion in FIG. 7c, which is again rotated to the same view as in FIG. 7a. This step can be described as optimizing the "metal2 (M2 732) runs on the metal1 (M1 731) and under the metal3 (M3 733)" structure. The Metal1 thickness and dielectric thickness between Metal1 and Metal1 have been optimized in the preceding step and are fixed them during the current optimization. This step will optimize Metal2 width, space, delta width, thickness of Metal2, and dielectric thickness between Metal3 and Metal3. The process continues in this manner until it reaches step n for the upper most interconnect layer, Mn 739, lying over layer M(n−1) 738 in FIG. 7d. The structure without top plate of FIG. 5b or 6b, is used to optimize Metal n Mn 739 and the bottom layers.

In a variation, the designer can reverse this process, optimizing from the top layers of FIG. 7d and working down to the substrate as in FIG. 7a. In this process, the designer would fix the top region's parameters first and then successively work through layers to the substrate. Also, if designer wants more fine-tuning subsequent to optimizing the top layer (or bottom layer in a top-down approach) in step n, a further optimization of the full structure of FIG. 7e can be performed. As this is a refinement of the earlier values, this will generally require a relatively small incremental increase in time.

The various aspects of the present invention provide a useful method that improves upon the prior art for a model provider to interface to EDA tools. In the prior art, it would typically be necessary to provide source code or possibly an API to the EDA tool. As noted above, in prior art methods, the mapping of parameters is a multiple to single mapping which leads to inconsistencies that are not readily resolved. By breaking most of the interconnect characterization or extraction into smaller geometries, the EDA tools can used more efficiently and accurately by reconstructing the complete structure by the sort of chain described with respect to FIGS. 5–7.

It is well known in the art that logic or digital systems and/or methods can include a wide variety of different components and different functions in a modular fashion. The following will be apparent to those of skill in the art from the teachings provided herein. Different embodiments of the present invention can include different combinations of elements and/or functions. Different embodiments of the present invention can include actions or steps performed in a different order than described in any specific example herein. Different embodiments of the present invention can include groupings of parts or components into larger parts or components different than described in any specific example herein. For purposes of clarity, the invention is described in terms of systems that include many different innovative components and innovative combinations of innovative components and known components. No inference should be taken to limit the invention to combinations containing all of the innovative components listed in any illustrative embodiment in this specification. The functional aspects of the invention, as will be understood from the teachings herein, may be implemented or accomplished using any appropriate implementation environment or programming language, such as C++, Java, JavaScript, etc. For example, a specific implementation allows RCPro™ to support the present invention in C visual or C/C++ on a windows platform.

The present invention is presented largely in terms of procedures, steps, logic blocks, processing, and other symbolic representations that resemble data processing devices. These process descriptions and representations are the means used by those experienced or skilled in the art to most effectively convey the substance of their work to others skilled in the art. The method along with the system to be described in detail below is a self-consistent sequence of processes or steps leading to a desired result. These steps or processes are those requiring physical manipulations of physical quantities. Usually, though not necessarily, these quantities may take the form of electrical signals capable of being stored, transferred, combined, compared, displayed and otherwise manipulated in a computer system or electronic computing devices. It proves convenient at times, principally for reasons of common usage, to refer to these signals as bits, values, elements, symbols, operations, messages, terms, numbers, or the like. It should be borne in mind that all of these similar terms are to be associated with the appropriate physical quantities and are merely convenient labels applied to these quantities. Unless specifically stated otherwise as apparent from the following description, it is appreciated that throughout the present invention, discussions utilizing terms such as processing or computing or verifying or displaying or the like, refer to the actions and processes of a computing device that manipulates and transforms data represented as physical quantities within the device's registers and memories into analog output signals via resident transducers.

Many aspects of the methods of the present invention will most commonly be implemented in software as a computer program product, although many of these can be implemented in hardware or by a combination of software and hardware. As will be understood in the art, the invention or components thereof may be embodied in a fixed media program component containing logic instructions and/or data that when loaded into an appropriately configured computing device cause that device to perform according to the invention. As will be understood in the art, a fixed media program may be delivered to a user on a fixed media for loading in a users computer or a fixed media program can reside on a remote server that a user accesses through a communication medium in order to download a program component. Examples of such fixed media include a disk-type optical or magnetic media, magnetic tape, solid state memory, etc. The invention may be embodied in whole or in part as software recorded on this fixed media.

The invention also may be embodied in whole or in part within the circuitry of an application specific integrated circuit (ASIC) or a microprocessor. In such a case, the invention may be embodied in a computer understandable descriptor language which may be used to create an ASIC or microprocessor that operates as herein described.

The techniques of FIG. 7, using the structures of FIGS. 5 and 6, thus provide a method for reconstructing an interconnect process technology file for interfacing with EDA tools, particularly a layout parameter extraction (LPE) tool. The generic structure of FIGS. 5a and 5b, along with the simplified form of FIGS. 6a and 6b, can be applied both to when a top plate is present (FIGS. 5a and 6a) and absent (FIGS. 5b and 6b). This allows for both planar and conformal structures to be treated, along with multi-dielectric and multi-conductor, such as copper damascene, processes. The optimization process can be executed either in a semi-automatic or in a substructure by substructure manual process, working either from the substrate up to the top layer or from the top down.

By using the structures of FIGS. 5 and 6, the methods of FIG. 7 readily allow for the incorporation of multi-dielectric and multi-conductor process into the optimization and analysis of an interconnect structure. The use of differing intra-layer and (possibly multiple) inter-layer dielectrics provides the ability to readily incorporate anisotropic dielectric strictures. By having the option of either including or not including a top plate, conformal structures can be handled along with planar structures. This provides improved flexibility for user designs, whether in memory or other applications.

In particular, by dividing the structure into three parts vertically, allowing for multi-layer dielectric regions, and treating a metal region as a single layer, conformal layers are readily incorporated. Anisotropy of the conformal dielectric structure is readily accounted for and the conformal structure can be readily calculated through field solver or analytical models. The described optimization process can characterize capacitance and resistance simultaneously in the optimization process. Additionally, it allows the use of field simulator or analytical equations for calculating of parasitics.

Although the invention has been described with respect to various exemplary embodiments, it will be understood that the invention is entitled to protection within the full scope of the appended claims.

It is claimed:

1. A method of establishing a set of parameter values for use in simulating the operation of an integrated circuit, the integrated circuit being formed of a structure comprising a conductive layer formed upon a substrate and a plurality of interconnect layers formed over the conductive layer, and including inter-layer and intra-layer dielectrics and a dielectric layer over the topmost of the interconnect layers, the method including:

for a first portion of the structure, characterized by a first subset of the parameters and including a first of said layers and a second layer adjacent to the first layer, optimizing the first portion of the structure to establish values for the first subset of the parameters; and for a second portion of the structure, characterized by a second subset of parameters and including the second of said layers and a third layer adjacent the second layer and distinct from the first, subsequently optimizing the second portion of the structure to establish values for the second subset, wherein the first and second subset share one or more of the parameters and the second subset is optimized holding the previously established values for the first subset fixed.

2. The method of claim 1, wherein said first layer is a polysilicon layer and said second layer is the adjacent interconnect layer, and wherein the first portion of the structure further includes the substrate and the dielectric region intermediate between the substrate and the poly layer.

3. The method of claim 1, wherein said first layer is the topmost of the interconnect layers and said second layer is the adjacent interconnect layer below the topmost of the interconnect layers.

4. The method of claim 1, wherein said dielectric layer over the topmost of the interconnect layers is a conformal structure.

5. The method of claim 1, wherein said dielectric layer over the topmost of the interconnect layers is a planar structure.

6. The method of claim 1, wherein said method is performed as a semi-automatic process.

7. The method of claim 1, wherein said method is performed as a manual process.

8. The method of claim 1, wherein the first portion of the structure further includes a fourth layer adjacent to the first layer and distinct from the first, second, and third layers.

9. The method of claim 1, wherein the second portion of the structure further includes a fourth layer adjacent to the first layer and distinct from the first, second, and third layers.

10. The method of claim 9, wherein the first portion of the structure further includes a fifth layer adjacent to the first layer and distinct from the first, second, third, and fourth layers.

11. The method of claim 1, further comprising:
subsequent to said optimizing the second portion of the structure, re-optimizing the combined first and second portions of the structure to refine the set of parameter values.

12. The method of claim 1, wherein one or more of said interconnect layers is a multi-conductor layer.

13. The method of claim 12, wherein said multi-conductor layer is copper damascene layer.

14. The method of claim 1, wherein one or more of said dielectrics form an anisotropic dielectric structure.

15. The method of claim 1, wherein one or more of said inter-layer dielectrics is a multi-layer dielectric.

16. The method of claim 1, wherein said set of parameter values are used for forming an interconnect process technology file.

17. The method of claim 16, wherein the interconnect process technology file is for interfacing to electronic design automation (EDA) tools.

18. The method of claim 1, wherein one or more of said dielectrics comprise multiple layers.

19. The method of claim 18, wherein an effective geometry is employed for said multi-layer dielectric layers.

20. The method of claim 1, wherein one or more of said interconnects comprises a multi-conductor layer.

21. The method of claim 20, wherein said multi-conductor layer is a copper damascene layer.

22. The method of claim 20, wherein an effective geometry is employed for said multi-conductor layer.

23. A computer readable storage device embodying a program of instructions executable by a computer to perform a method of establishing a set of parameter values for use in simulating the operation of an integrated circuit, the integrated circuit being formed of a structure comprising a conductive layer formed upon a substrate and a plurality of interconnect layers formed over the conductive layer, and including inter-layer and intra-layer dielectrics and a dielectric layer over the topmost of the interconnect layers, said method comprising:

for a first portion of the structure, characterized by a first subset of the parameters and including a first of said layers and a second layer adjacent to the first layer, optimizing the first portion of the structure to establish values for the first subset of the parameters; and for a second portion of the structure, characterized by a second subset of parameters and including the second of said layers and a third layer adjacent the second layer and distinct from the first, subsequently optimizing the second portion of the structure to establish values for the second subset, wherein the first and second subset share one or more of the parameters and the second subset is optimized holding the previously established values for the first subset fixed.

24. The method of claim 23, wherein said method is performed as a semi-automatic process.

25. The method of claim 23, wherein said method is performed as a manual process.

26. A method for transmitting a program of instructions executable by a computer to perform a process of establishing a set of parameter values for use in simulating the operation of an integrated circuit, the integrated circuit being formed of a structure comprising a conductive layer formed upon a substrate and a plurality of interconnect layers formed over the conductive layer, and including inter-layer and intra-layer dielectrics and a dielectric layer over the topmost of the interconnect layers, said process comprising:

for a first portion of the structure, characterized by a first subset of the parameters and including a first of said layers and a second layer adjacent to the first layer, optimizing the first portion of the structure to establish values for the first subset of the parameters; and for a second portion of the structure, characterized by a second subset of parameters and including the second of said layers and a third layer adjacent the second layer and distinct from the first, subsequently optimizing the second portion of the structure to establish values for the second subset, wherein the first and second subset share one or more of the parameters and the second subset is optimized holding the previously established values for the first subset fixed.

27. The method of claim 26, wherein said process is performed as a semi-automatic process.

28. The method of claim 26, wherein said process is performed as a manual process.

* * * * *